United States Patent
Wei et al.

(10) Patent No.: US 10,345,720 B2
(45) Date of Patent: Jul. 9, 2019

(54) PHOTOLITHOGRAPHY TOOL AND METHOD FOR COMPENSATING FOR SURFACE DEFORMATION IN CARRIER OF PHOTOLITHOGRAPHY TOOL

(71) Applicant: SHANGHAI MICRO ELECTRONICS EQUIPMENT (GROUP) CO., LTD., Shanghai (CN)

(72) Inventors: Yinlei Wei, Shanghai (CN); Feihong Liao, Shanghai (CN); Fuqiang Yang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/907,999

(22) Filed: Feb. 28, 2018

(65) Prior Publication Data
US 2018/0246412 A1    Aug. 30, 2018

(30) Foreign Application Priority Data
Feb. 28, 2017    (CN) .......................... 2017 1 0114397

(51) Int. Cl.
  G03B 27/42    (2006.01)
  G03B 27/52    (2006.01)
  G03F 7/20     (2006.01)

(52) U.S. Cl.
  CPC .......... *G03F 7/709* (2013.01); *G03F 7/70691* (2013.01); *G03F 7/70783* (2013.01)

(58) Field of Classification Search
  CPC ............. G03F 7/70716; G03F 7/70725; G03F 7/70775; G03F 7/707; G03F 7/7085; G03F 7/70758; G03F 7/70825; G03F 7/70866; G03F 7/70816; G03F 9/7026; G03F 9/7034
  See application file for complete search history.

(56) References Cited

U.S. PATENT DOCUMENTS

2002/0080339 A1*   6/2002   Takahashi .............. G03B 27/58
                                                        355/72
2017/0146689 A1*   5/2017   Kryszczynski .......... G01V 1/18

\* cited by examiner

*Primary Examiner* — Mesfin T Asfaw
(74) *Attorney, Agent, or Firm* — Muncy, Geissler, Olds & Lowe, P.C.

(57) ABSTRACT

A photolithography tool and a method for compensating for surface deformation in a carrier of the photolithography tool are disclosed. In the photolithography tool, carrier surface deformation compensation elements are provided at the bottom of the carrier, which are capable of compensating for the surface deformation in the carrier. In the method, the surface deformation is detected by carrier surface deformation detection modules, and an automated closed-loop controller controls compensating forces exerted by the carrier surface deformation compensation elements based on the detected deformation. This allows more accurate compensation for the carrier surface deformation.

10 Claims, 4 Drawing Sheets

PHOTOLITHOGRAPHY TOOL AND METHOD FOR COMPENSATING FOR SURFACE DEFORMATION IN CARRIER OF PHOTOLITHOGRAPHY TOOL

CROSS-REFERENCES TO RELATED APPLICATIONS

This application claims the priority of Chinese patent application number 201710114397.0, filed on Feb. 28, 2017, the entire contents of which are incorporated herein by reference.

TECHNICAL FIELD

The present invention relates to the field of photolithography tools for manufacturing semiconductor devices and, in particular, to a photolithography tool and a method for compensating for a surface deformation in a carrier of the photolithography tool.

BACKGROUND

In a photolithography tool, a wafer stage subsystem is one of the most critical subsystems, especially in a scanner for manufacturing flat panel displays. The accuracy and stability of a wafer stage subsystem directly determines the yield, overlay accuracy and imaging quality of the photolithography tool. Compared with photolithography tools of other types, a scanner for manufacturing flat panel displays adopts a wafer stage subsystem that is typically imposed with more critical requirements for accuracy and stability because of its larger stroke, faster scanning speed, higher load, greater motor reaction and other use conditions.

With the motion precision of photolithography tools increasing, they are required to have increasingly higher anti-vibration performance. At present, active vibration dampers are employed for fine vibration isolation, which can, on the one hand, isolate important internal components from the external world including the main frame so as to create a "quiet" environment for the internal world and, on the other hand, support each of a carrier, a wafer stage, a mask stage and an objective lens. As the surface of the carrier is leveled under the control of a position control loop of the vibration dampers, and since the vibration dampers are subject to varying loads during movement of the wafer stage among various locations, in order to speed up the response of the vibration dampers, forces acting on the supported locations are calculated, with the carrier considered as a rigid body, and are applied to the control system of the vibration dampers as forward feeds. With this approach, the vibration dampers can ensure sufficient surface flatness in case of a small marble base. However, with the increasing expansion of wafer stages in size, increasingly greater sized carriers are required. When vibration dampers are deployed at edge portions of such a carrier, a central portion of the carrier may be deformed by the weight of the wafer stage and that of the carrier itself, which may in turn lead to deformation of aerostatic slideways. As a result, the aerostatic clearance may experience variations during the movement of the wafer stage, which can deteriorate the motion performance of the wafer stage. Therefore, maintaining the surface planarity of the carrier is important to the performance of the wafer stage.

SUMMARY OF THE INVENTION

In order to overcome the above-described problems, the present invention proposes a photolithography tool and a method for compensating for surface deformation in a carrier of the photolithography tool, in which carrier surface deformation compensation elements are provided on the bottom of the carrier and compensating forces exerted by the carrier surface deformation compensation elements are controlled based on the surface deformation in the carrier.

To this end, the present invention provides a photolithography tool having a carrier for carrying a wafer stage. The carrier is provided with carrier surface deformation compensation elements for compensating for surface deformation in the carrier. The carrier is further provided with carrier surface deformation detection modules for acquiring information about the surface deformation in the carrier. The photolithography tool further comprises an automated closed-loop controller that is connected to the carrier surface deformation compensation elements and configured to control compensating forces exerted by the carrier surface deformation compensation elements to the carrier based on the information about the surface deformation in the carrier.

Preferably, the carrier surface deformation compensation elements may be implemented as vibration dampers, with of the vibration damper each composed of an airbag and a linear motor.

Preferably, each of the carrier surface deformation compensation elements may have one end fixed to a ground and the other end fixed to a bottom surface of the carrier.

Preferably, the carrier surface deformation detection modules may be foil strain gauges attached to a bottom surface of the carrier.

Preferably, the carrier surface deformation detection modules may be piezoelectric sensors fixedly received in grooves formed in a bottom surface of the carrier.

Preferably, the wafer stage may be provided with a position feed-forward response device for measuring a position of the wafer stage, wherein the photolithography tool further comprises a processor that is connected to the carrier surface deformation compensation elements and configured to control the compensating forces exerted by the carrier surface deformation compensation elements to the carrier based on the position of the wafer stage.

Preferably, the processor may be integrated with, or separate from, the automated closed-loop controller.

The present invention also provides a method for compensating for surface deformation in a carrier of a photolithography tool, comprising:

1) providing carrier surface deformation detection modules at a bottom of the carrier;

2) recording data detected by the carrier surface deformation detection modules and compensating forces exerted by carrier surface deformation compensation elements to the carrier that cause strains generated from the surface deformation of the carrier to be less than a threshold;

3) stepping the wafer stage, and repeating step 2) for each step until a farthest point of the wafer stage is reached;

4) least-square fitting the date recorded in steps 2) and 3); and 5) providing an automated closed-loop controller that is connected to the carrier surface deformation compensation elements and configured to control the compensating forces exerted by the carrier surface deformation compensation elements during movement of the wafer stage based on the fitted data obtained in step 4).

Preferably, step 4) may comprise least-square fitting the data detected by the carrier surface deformation detection modules and the compensating forces exerted by the carrier surface deformation compensation elements to the carrier, wherein step 5) comprises controlling the compensating forces exerted by the carrier surface deformation compensation elements based on the data detected by the carrier surface deformation detection modules.

Preferably, the wafer stage may be provided with a position feed-forward response device, wherein concurrently with the recording of the data detected by the carrier surface deformation detection modules in step 2) and 3), real-time positional coordinates of the wafer stage displayed by the position feed-forward response device are recorded, wherein step 4) further comprises least-square fitting the real-time positional coordinates and the data detected by the carrier surface deformation detection modules, and wherein step 5) further comprises controlling the compensating forces exerted by the carrier surface deformation compensation elements based on the real-time positional coordinates.

Compared with the prior art, the present invention offers the following benefits: it provides a photolithography tool having a carrier provided with carrier surface deformation compensation elements on its bottom, which can provide the carrier with compensating forces for compensating for its surface deformation.

The present invention also provides a method for compensating for surface deformation in the carrier of the photolithography tool, in which carrier surface deformation detection modules are provided on the bottom of the carrier for detecting and recording information about the deformation (usually strains) in the carrier. An automated closed-loop controller is further provided for controlling compensating forces exerted by the carrier surface deformation compensation elements. A wafer stage is moved, and data detected by the carrier surface deformation detection modules are recorded after each increment. The recorded deformation data and compensating forces are least-square fitted and input into the automated closed-loop controller so that during movement of the wafer stage and during real-time scanning exposure, the automated closed-loop controller can control compensating forces produced by the carrier surface deformation compensation elements in real time based on the fitted data.

The above-discussed photolithography tool and method are capable of more accurate compensation for surface deformation in the carrier through controlling, by the automated closed-loop controller, compensating forces exerted by the carrier surface deformation compensation elements based on the least-square fitted data obtained from strain measurements from the carrier surface deformation detection modules and compensating force measurements from the carrier surface deformation compensation elements.

In these figures, 1 denotes a vibration damper; 2, a foil strain gauge; 3, a carrier; 4, a groove; and 5, a piezoelectric ceramic sensor.

DETAILED DESCRIPTION

Specific embodiments of the present invention are described below in greater detail so that its foregoing objectives, features and advantages will become more apparent and readily understandable.

Embodiment 1

Figure 1:
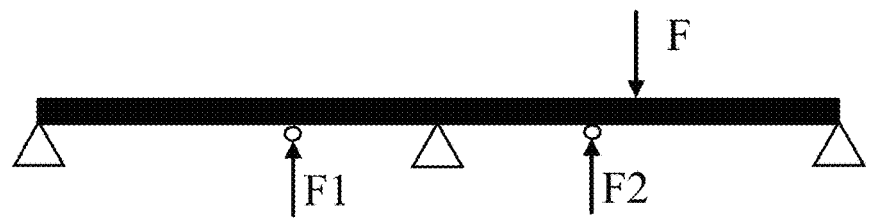
FIG. 1 is a diagram illustrating how carrier surface deformation compensation elements perform compensation in accordance with a first embodiment of the present invention.
Figure 2:
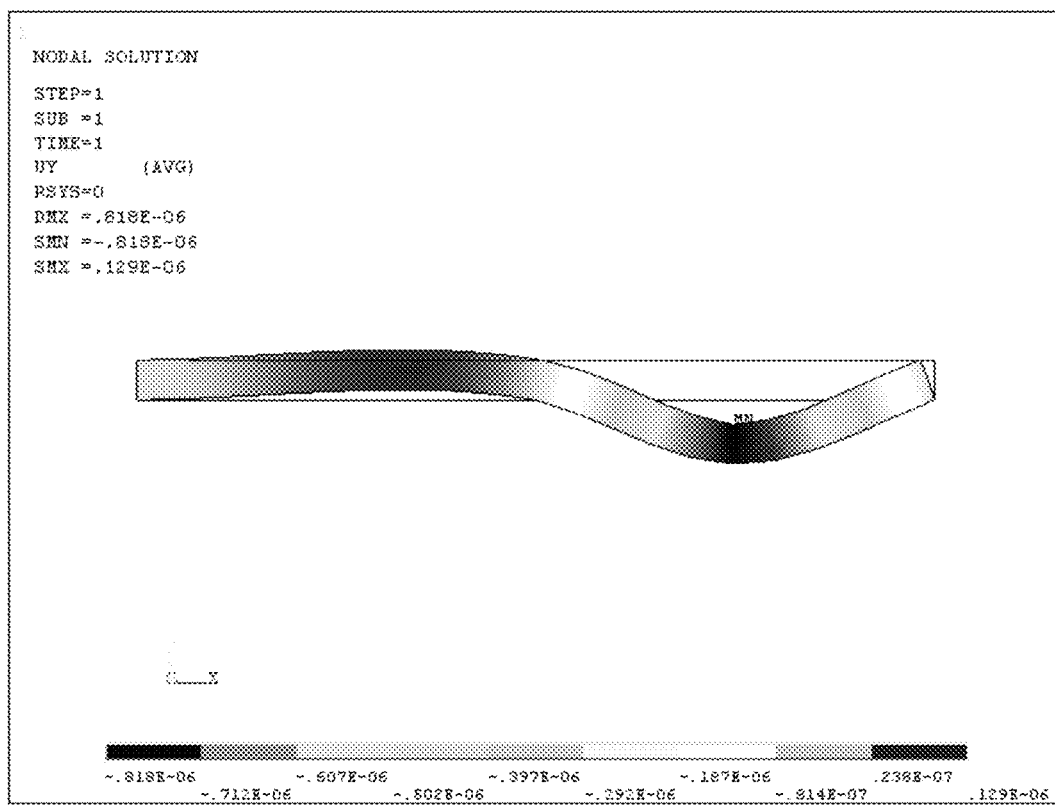
FIG. 2 schematically illustrates the computation results of a model for simulating surface deformation of a carrier with compensating forces not being applied in accordance with the first embodiment of the present invention.

Referring to FIG. 1, as revealed in the computation results of a mechanical simulation model, the surface of a carrier will be deformed in response to a concentrated load applied to a plane where the carrier is located, and the maximum strain generated will be generally up to 0.818e-6 m (FIG. 2). As a result, a wafer stage placed on top of the carrier cannot maintain its horizontality any more.

Figure 3:
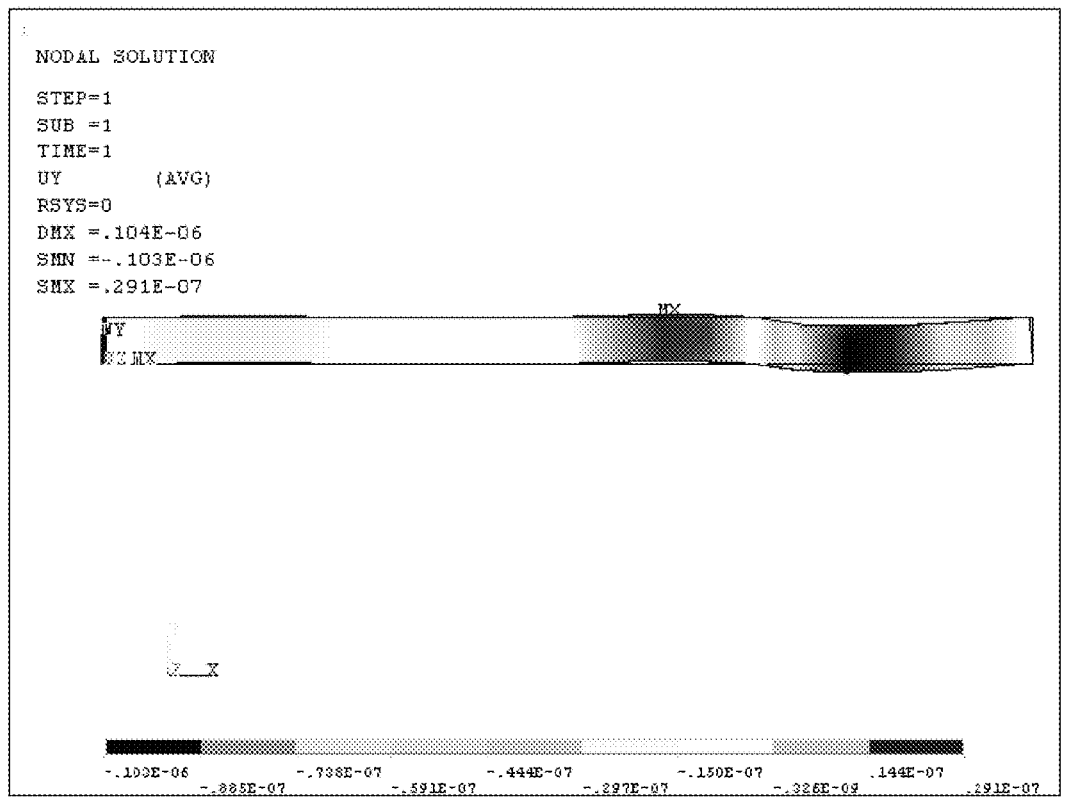
FIG. 3 schematically illustrates the computation results of the model for simulating surface deformation of the carrier when compensating forces are applied in accordance with the first embodiment of the present invention.

Accordingly, the present invention provides a photolithography tool in which, as shown in FIG. 1, carrier surface deformation compensation elements are provided on the carrier to compensate for its surface deformation. The number and locations of the carrier surface deformation compensation elements may be determined according to the practical needs. For example, two carrier surface deformation compensation elements may be disposed along a line and each in a region of the carrier between its center and edge. Alternatively, three carrier surface deformation compensation elements may be distributed in a triangle in a region of the carrier between its center and edge. Under the action of the compensating forces indicated by F1 and F2 (FIG. 1), the maximum strain of the carrier will be significantly reduced to 0.104e-6 m, as shown in FIG. 3.

Preferably, the carrier surface deformation compensation elements may be vibration dampers 1 which are usually each composed of an airbag and a linear motor. The linear motors may be able to control the compensating forces exerted by the carrier surface deformation compensation elements (i.e., vibration dampers 1) through adjusting the amounts of air filled in the respective airbags. In particular, each of the carrier surface deformation compensation elements (specifically its airbag) may have one end in contact with the ground and the other end in contact with the surface of a marble base of the carrier.

Figure 4:
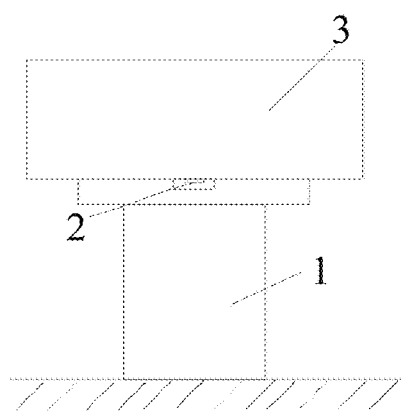
FIG. 4 is a partial view schematically showing the position of a foil strain gauge in accordance with the first embodiment of the present invention.

Preferably, the carrier is further provided with carrier surface deformation detection modules. In this embodiment, referring to FIG. 4, the carrier surface deformation detection modules are foil strain gauges 2 which are sensors for detecting strains generated from the surface deformation in the carrier. The strains are then taken as inputs for so controlling outputs of the vibration dampers 1 that they are minimized. Here, the strains are reduced to be below a threshold which can be predefined according to the precision requirements.

Figure 5:
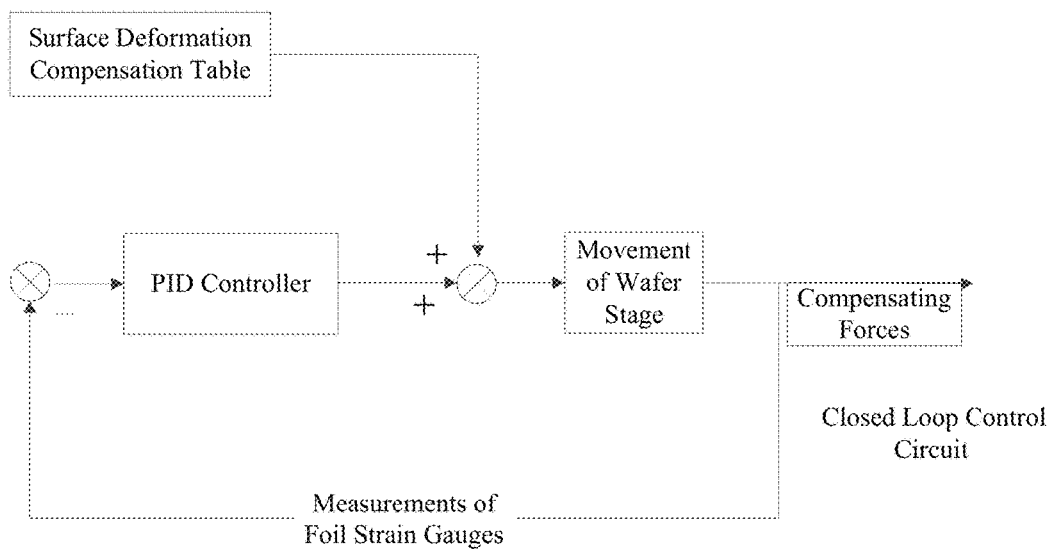
FIG. 5 schematically illustrates a closed-loop control process in accordance with the first embodiment of the present invention.

Referring to FIG. 5, an automated closed-loop controller, implemented as a PID controller in this embodiment, is provided in connection with the vibration dampers 1 for controlling the compensating forces exerted by the vibration dampers 1 to the carrier. Specifically, the automated closed-loop controller may be wired or wirelessly connected to the carrier surface deformation compensation elements and, in particular, to the linear motors therein so as to control the compensating forces exerted by the carrier surface deformation compensation elements through adjusting the outputs of the motors. Further, the automated closed-loop controller may also be wired or wirelessly connected to the carrier surface deformation detection modules to acquire information about surface deformation in the carrier and, based on such information, to control the compensating forces exerted by the carrier surface deformation compensation elements to the carrier.

The present invention also provides a method for compensating for surface deformation in a carrier for use with the photolithography tool as defined above. With continued reference to FIG. 5, the method includes the steps as set forth below.

In Step 1, in order to precisely control the compensating forces exerted by the vibration dampers 1 to the carrier, a relationship between strains in the carrier and compensating forces exerted by the vibration dampers 1 is calibrated prior to the surface deformation compensation. To this end, the foil strain gauges 2 may be deployed on the bottom of the carrier, preferably at locations in the vicinity of the vibration dampers 1. Specifically, the foil strain gauges 2 may be mounted after the carrier is leveled, followed by moving the wafer stage to a farthest point in the X- or Y-direction.

In Step 2, strains s1 measured by the foil strain gauges 2 are recorded, and the vibration dampers 1 are manipulated to produce forces for compensating for the surface deformation until the strains are less than a predefined threshold c. The compensating forces F1 produced by the vibration dampers 1 at this point are recorded and the compensating forces are then deactivated after completing the recording.

In Step 3, the wafer stage is stepped along the X- or Y-direction, and recording of the strains and corresponding compensating forces as in Step 2 is repeated subsequent to each step until the opposite farthest point in the X- or Y-direction is reached. All the measurements are then summarized into the following Table 1.

TABLE 1

Relationship between Strains and Compensating Forces

| No. | Strain | Compensating Force |
|---|---|---|
| 1 | s1 | F1 |
| 2 | s2 | F2 |
| 3 | s3 | F3 |
| ... | ... | ... |
| ... | ... | ... |

Data in the table, i.e., the strains measurements from the carrier surface deformation detection modules and the compensating force measurements from the carrier surface deformation compensation elements, are fitted using a least-square method so that a relationship between strains and compensating forces exerted by the vibration dampers 1 is obtained.

In Step 4, the aforementioned information, i.e., the relationship between strains and compensating forces exerted by the vibration dampers 1, is input into the PID controller. As such, when the wafer stage is moved (to a certain location) during the scanning exposure, the carrier surface deformation detection modules measure strains generated from surface deformation in the carrier in real time, and the PID controller controls compensating forces exerted by the vibration dampers 1 based both upon the strain measurements and the aforementioned least-square fitted curve.

The above-discussed photolithography tool and method are capable of more accurate compensation for surface deformation in a carrier through controlling, by the automated closed-loop controller, compensating forces exerted by the carrier surface deformation compensation elements based on the least-square fitted data obtained from strain measurements from the carrier surface deformation detection modules and compensating force measurements from the carrier surface deformation compensation elements.

Figure 6:
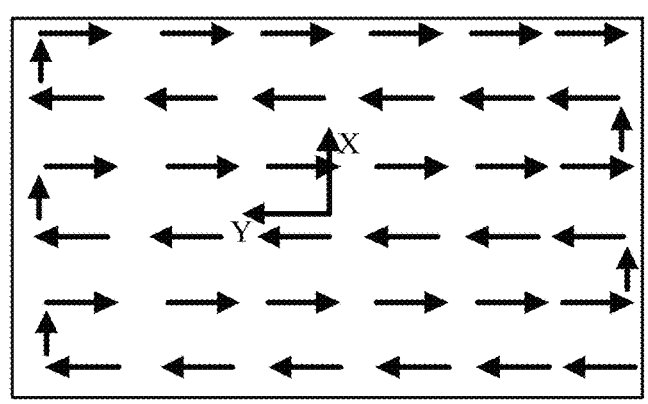
FIG. 6 is a diagram schematically illustrating a stepping path of a wafer stage in accordance with the first embodiment of the present invention.

Optionally, the wafer stage may be stepped along the path shown in FIG. 6 with the carrier surface deformation compensation elements not exerting compensating forces. Subsequent to each step, real-time positional coordinate of the wafer stage displayed by a position feed-forward response device may be recorded, and foil strain gauges 2 may record strains in the carrier generated due to the wafer stage. The recorded data may then be summarized in the following Table 2.

TABLE 2

Surface Deformation Compensation Table

| No. | X-Coordinate | Y-Coordinate | Strain |
|---|---|---|---|
| 1 | X1 | Y1 | s'1 |
| 2 | X2 | Y2 | s'2 |
| 3 | X3 | Y3 | s'3 |
| ... | ... | ... | ... |
| ... | ... | ... | ... |

From Tables 1 and 2, a relationship between positions of the wafer stage and compensating forces produced by the carrier surface deformation compensation elements can be further obtained. The data in the above table may be input into the PID controller as machine constants, based on which, strains corresponding to various positions of the wafer stage during its travel can be obtained by interpolation. These strain values may be treated as feed-forward signals and output to the vibration dampers 1 for controlling its compensating forces. In other words, in this embodiment, a processor storing the above Table 2 (Surface Deformation Compensation Table) may be further integrated in the automated closed-loop controller. More preferably, the processor may store a least-square fitted curve obtained based on the real-time coordinates and the data from the carrier surface deformation detection modules. In addition, with continued reference to FIG. 5, when the wafer stage is moved (to a certain position), the position feed-forward response device may measure this position of the wafer stage, and based on these real-time coordinate measurements of the wafer stage, the processor may obtain corresponding strains from Table 2 or the least-square fitted curved obtained based on the data in Table 2 and then control compensating forces exerted by the carrier surface deformation compensation elements to the carrier based on Table 1 or the least-square fitted curved obtained based on the data in Table 1. Alternatively, the processor may be separated from the automated closed-loop controller.

Use of the position feed-forward response device enables prevention of delay in the PID control and hence higher response speed of the vibration dampers 1.

Embodiment 2

Figure 7:
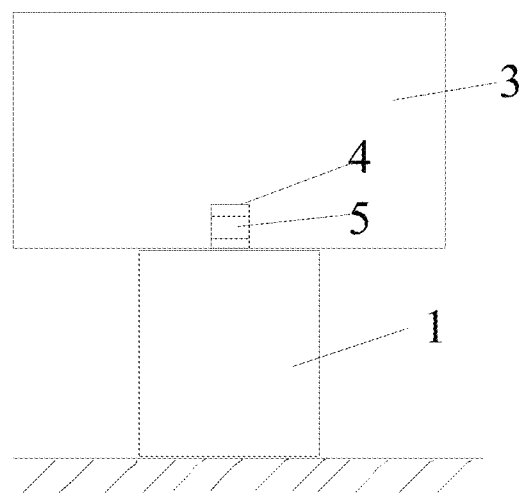
FIG. 7 is a partial view schematically showing deployment of a piezoelectric ceramic sensor in accordance with a second embodiment of the present invention.

Referring to FIG. 7, this embodiment differs from Embodiment 1 in that the carrier surface deformation detection modules are implemented as piezoelectric ceramic sensors 5 which are received within grooves 4 formed in the bottom of the carrier 3 and pre-compressed using preloads. In this embodiment, data obtained by the piezoelectric ceramic sensors 5 are used in lieu of the strain measurements s1 in Embodiment 1. In other embodiments of the present invention, information about surface deformation in the carrier may also be acquired using other detection devices, and the present invention is not limited in this regard. Multiple carrier surface deformation detection modules may be used, and the number of them may be adapted to the practical precision requirements. Preferably, the multiple carrier surface deformation detection modules are uniformly distributed on the carrier.

While the present invention has been described with reference to the foregoing embodiments, it is not limited thereto in any sense. It is apparent that those skilled in the art can make various modifications and variations to the present invention without departing from the spirit and scope thereof. Accordingly, it is intended that all such modifications and variations are embraced in the scope of the invention if they fall within the scope of the appended claims and their equivalents.

What is claimed is:

1. A photolithography tool having a carrier for carrying a wafer stage, wherein the carrier is provided with carrier surface deformation compensation elements for compensating for surface deformation in the carrier, wherein the carrier is further provided with carrier surface deformation detection modules for acquiring information about the surface deformation in the carrier, wherein the photolithography tool further comprises an automated closed-loop controller that is connected to the carrier surface deformation compensation elements and configured to control compensating forces exerted by the carrier surface deformation compensation elements to the carrier based on the acquired information about the surface deformation in the carrier and a relationship between strains in the carrier and compensating forces exerted by the carrier surface deformation compensation elements.

2. The photolithography tool of claim 1, wherein the carrier surface deformation compensation elements are implemented as vibration dampers, with each of the vibration damper composed of an airbag and a linear motor.

3. The photolithography tool of claim 1, wherein each of the carrier surface deformation compensation elements has one end fixed to a ground and the other end fixed to a bottom surface of the carrier.

4. The photolithography tool of claim 1, wherein the carrier surface deformation detection modules are foil strain gauges attached to a bottom surface of the carrier.

5. The photolithography tool of claim 1, wherein the carrier surface deformation detection modules are piezoelectric sensors fixedly received in grooves formed in a bottom surface of the carrier.

6. The photolithography tool of claim 1, wherein the wafer stage is provided with a position feed-forward response device for measuring a position of the wafer stage, and wherein the photolithography tool further comprises a processor that is connected to the carrier surface deformation compensation elements and configured to control the compensating forces exerted by the carrier surface deformation compensation elements to the carrier based on the position of the wafer stage.

7. The photolithography tool of claim 6, wherein the processor is integrated with, or separate from, the automated closed-loop controller.

8. A method for compensating for surface deformation in a carrier of a photolithography tool, comprising:
   1) providing carrier surface deformation detection modules at a bottom of the carrier;
   2) recording data detected by the carrier surface deformation detection modules and compensating forces exerted by carrier surface deformation compensation elements to the carrier that cause strains generated from the surface deformation of the carrier to be less than a threshold;
   3) stepping the wafer stage, and repeating step 2) for each step until a farthest point of the wafer stage is reached;
   4) least-square fitting the data recorded in steps 2) and 3) to obtain a relationship between strains in the carrier and compensating forces exerted by the carrier surface deformation compensation elements; and
   5) providing an automated closed-loop controller that is connected to the carrier surface deformation compensation elements and configured to control the compensating forces exerted by the carrier surface deformation compensation elements during movement of the wafer stage based on the relationship obtained in step 4).

9. The method of claim 8, wherein step 4) comprises least-square fitting the data detected by the carrier surface deformation detection modules and the compensating forces exerted by the carrier surface deformation compensation elements to the carrier; and wherein step 5) comprises controlling the compensating forces exerted by the carrier surface deformation compensation elements further based on the data detected by the carrier surface deformation detection modules.

10. The method of claim 8, wherein the wafer stage is provided with a position feed-forward response device, wherein concurrently with the recording of the data detected by the carrier surface deformation detection modules in steps 2) and 3), real-time positional coordinates of the wafer stage displayed by the position feed-forward response device are recorded, wherein step 4) further comprises least-square fitting the real-time positional coordinates and the data detected by the carrier surface deformation detection modules, and wherein step 5) further comprises controlling the compensating forces exerted by the carrier surface deformation compensation elements based on the real-time positional coordinates.

* * * * *